United States Patent
Lee et al.

(10) Patent No.: US 10,804,340 B2
(45) Date of Patent: Oct. 13, 2020

(54) DISPLAY DEVICE WITH LIGHT TRANSMISSION CONTROL LAYER

(71) Applicant: SAMSUNG DISPLAY CO., LTD., Yongin-si, Gyeonggi-do (KR)

(72) Inventors: Dongki Lee, Yongin-si (KR); Hyeonbum Lee, Yongin-si (KR)

(73) Assignee: SAMSUNG DISPLAY CO., LTD., Yongin-si, Gyeonggi-Do (KR)

( * ) Notice: Subject to any disclaimer, the term of this patent is extended or adjusted under 35 U.S.C. 154(b) by 2 days.

(21) Appl. No.: 16/237,905

(22) Filed: Jan. 2, 2019

(65) Prior Publication Data

US 2019/0214440 A1   Jul. 11, 2019

(30) Foreign Application Priority Data

Jan. 8, 2018   (KR) .................. 10-2018-0002139

(51) Int. Cl.
 *H01L 27/32*   (2006.01)
 *H01L 51/52*   (2006.01)
 (Continued)

(52) U.S. Cl.
 CPC .......... *H01L 27/3232* (2013.01); *G06F 3/044* (2013.01); *G06F 3/0412* (2013.01); (Continued)

(58) Field of Classification Search
 CPC ...... G06F 3/044; G06F 3/0412; G06F 3/0443; G06F 3/0446; G06F 2203/04111; G06F 2203/04112; H01L 27/3232; H01L 27/322; H01L 27/3246; H01L 51/5284; H01L 27/323

See application file for complete search history.

(56) References Cited

U.S. PATENT DOCUMENTS 7,609,339 B2   10/2009   Choi
8,466,466 B2 *   6/2013   Ha ..................... H01L 51/5072
                                                        257/59

(Continued)

FOREIGN PATENT DOCUMENTS

KR        10-1268954 B1    5/2013
KR     10-2015-0086763 A   7/2015
(Continued)

*Primary Examiner* — Kwang-Su Yang
(74) *Attorney, Agent, or Firm* — Kile Park Reed & Houtteman PLLC

(57) ABSTRACT

A display device including a substrate, a circuit portion including a thin film transistor on the substrate, a display element on the circuit portion, the display element including a pixel electrode electrically connected to the thin film transistor, an encapsulation layer covering the display element, a color filter layer on the encapsulation layer, the color filter layer including a black matrix and a color filter, and a light transmission control layer located farther from the display element than the color filter layer in a direction perpendicular to an upper surface of the substrate, the light transmission control layer having light transmittance that varies according to an electrical signal. The light transmission control layer overlaps the black matrix. A width of the light transmission control layer is greater than a width of the black matrix.

18 Claims, 12 Drawing Sheets

(51) Int. Cl.
*G06F 3/041* (2006.01)
*G06F 3/044* (2006.01)

(52) U.S. Cl.
CPC .......... *G06F 3/0443* (2019.05); *G06F 3/0446* (2019.05); *H01L 27/322* (2013.01); *H01L 27/3246* (2013.01); *H01L 51/5284* (2013.01); *G06F 2203/04111* (2013.01); *G06F 2203/04112* (2013.01); *H01L 27/323* (2013.01)

(56) References Cited

U.S. PATENT DOCUMENTS

| | | | |
|---|---|---|---|
| 8,502,444 B2 | 8/2013 | Chu et al. | |
| 8,624,868 B2 | 1/2014 | Chang et al. | |
| 9,046,952 B2 | 6/2015 | Kim et al. | |
| 9,437,840 B2 | 9/2016 | Choi et al. | |
| 2015/0041777 A1* | 2/2015 | Chung | H01L 51/5271 257/40 |
| 2015/0206926 A1 | 7/2015 | Hong et al. | |
| 2016/0351631 A1 | 12/2016 | Lee | |
| 2017/0090634 A1* | 3/2017 | Yang | G06F 3/0412 |
| 2017/0293171 A1* | 10/2017 | Yamazaki | G02F 1/133603 |
| 2019/0146622 A1* | 5/2019 | Kang | G06F 3/044 345/173 |

FOREIGN PATENT DOCUMENTS

| | | |
|---|---|---|
| KR | 10-2016-0043227 A | 4/2016 |
| KR | 10-2016-0068105 A | 6/2016 |
| KR | 10-2016-0140089 A | 12/2016 |

\* cited by examiner

DISPLAY DEVICE WITH LIGHT TRANSMISSION CONTROL LAYER

CROSS-REFERENCE TO RELATED APPLICATION

Korean Patent Application No. 10-2018-0002139, filed on Jan. 8, 2018, in the Korean Intellectual Property Office, and entitled: "Display Device," is incorporated by reference herein in its entirety.

BACKGROUND

1. Field

One or more embodiments relate to a display device.

2. Description of the Related Art

With the development of display devices for visually displaying images from electrical signals, a display device has been variously used for portable electronic devices.

SUMMARY

Embodiments are directed to a display device including a substrate, a circuit portion including a thin film transistor on the substrate, a display element on the circuit portion, the display element including a pixel electrode electrically connected to the thin film transistor, an encapsulation layer covering the display element, a color filter layer on the encapsulation layer, the color filter layer including a black matrix and a color filter, and a light transmission control layer located farther from the display element than the color filter layer in a direction perpendicular to an upper surface of the substrate, the light transmission control layer having light transmittance that varies according to an electrical signal. The light transmission control layer overlaps the black matrix. A width of the light transmission control layer is greater than a width of the black matrix.

Each of the light transmission control layer and the black matrix may include an open area corresponding to the pixel electrode. A width of the open area of the light transmission control layer is less than a width of the open area of the black matrix.

The pixel electrode may include a first pixel electrode and a second pixel electrode that neighbor each other. The display device may further include a pixel defining layer having openings that respectively expose the first pixel electrode and the second pixel electrode, and a mound portion between the openings. The black matrix and the light transmission control layer may overlap the mound portion of the pixel defining layer.

The black matrix may include open areas corresponding to each of the first pixel electrode and the second pixel electrode. A width of each of the open areas of the black matrix may be greater than a width of a corresponding one of the openings of the pixel defining layer.

The light transmission control layer may include open areas corresponding to each of the first pixel electrode and the second pixel electrode. A width of the open areas of the light transmission control layer may be substantially the same as the width of a corresponding one of the openings of the pixel defining layer.

The light transmission control layer may have a light transmittance of 90% or more when an electrical signal is applied thereto.

The display device may further include a touch electrode layer between the encapsulation layer and the color filter layer, the touch electrode layer including a touch electrode.

The display element may include an organic light-emitting diode.

The light transmission control layer may include at least one of a suspended-particle device layer and a polymer dispersed liquid crystal layer.

Embodiments are also directed to a display device including a substrate, a first pixel electrode and a second pixel electrode on the substrate, a pixel defining layer including openings that respectively expose the first pixel electrode and the second pixel electrode, and a mound portion between the openings, a first intermediate layer overlapping the first pixel electrode in one of the openings of the pixel defining layer, a second intermediate layer overlapping the second pixel electrode through another one of the openings of the pixel defining layer, a counter electrode covering the first intermediate layer and the second intermediate layer, a color filter layer on the counter electrode, the color filter layer including a black matrix and a color filter, and a light transmission control layer located farther from the substrate than the color filter layer in a direction perpendicular to an upper surface of the substrate, the light transmission control layer having a light transmittance that varies according to an electrical signal. The black matrix and the light transmission control layer may include open areas respectively corresponding to the first pixel electrode and the second pixel electrode. A width of each of the open areas of the light transmission control layer may be less than a width of each of the open areas of the black matrix.

A width of each of each of the open areas of the light transmission control layer may be substantially the same as a width of the corresponding one of the openings of the pixel defining layer.

A width of the each of the open areas of the black matrix may be greater than the width of the corresponding one of the openings of the pixel defining layer.

The light transmission control layer may have light transmittance of 90% or more when an electrical signal is applied thereto.

The display device may further include an encapsulation layer between the counter electrode and the color filter layer. The encapsulation layer may include at least one inorganic encapsulation layer and at least one organic encapsulation layer.

The display device may further include a touch electrode layer between the counter electrode and the color filter layer, the touch electrode layer including a touch electrode.

The touch electrode may include an open area that overlaps an open area of the black matrix.

Each of the first intermediate layer and the second intermediate layer may include an emission layer.

The light transmission control layer may include at least one of a suspended-particle device layer and a polymer dispersed liquid crystal layer.

BRIEF DESCRIPTION OF THE DRAWINGS

Features will become apparent to those of ordinary skill in the art by describing in detail exemplary embodiments with reference to the attached drawings in which.

DETAILED DESCRIPTION

Figure 1:
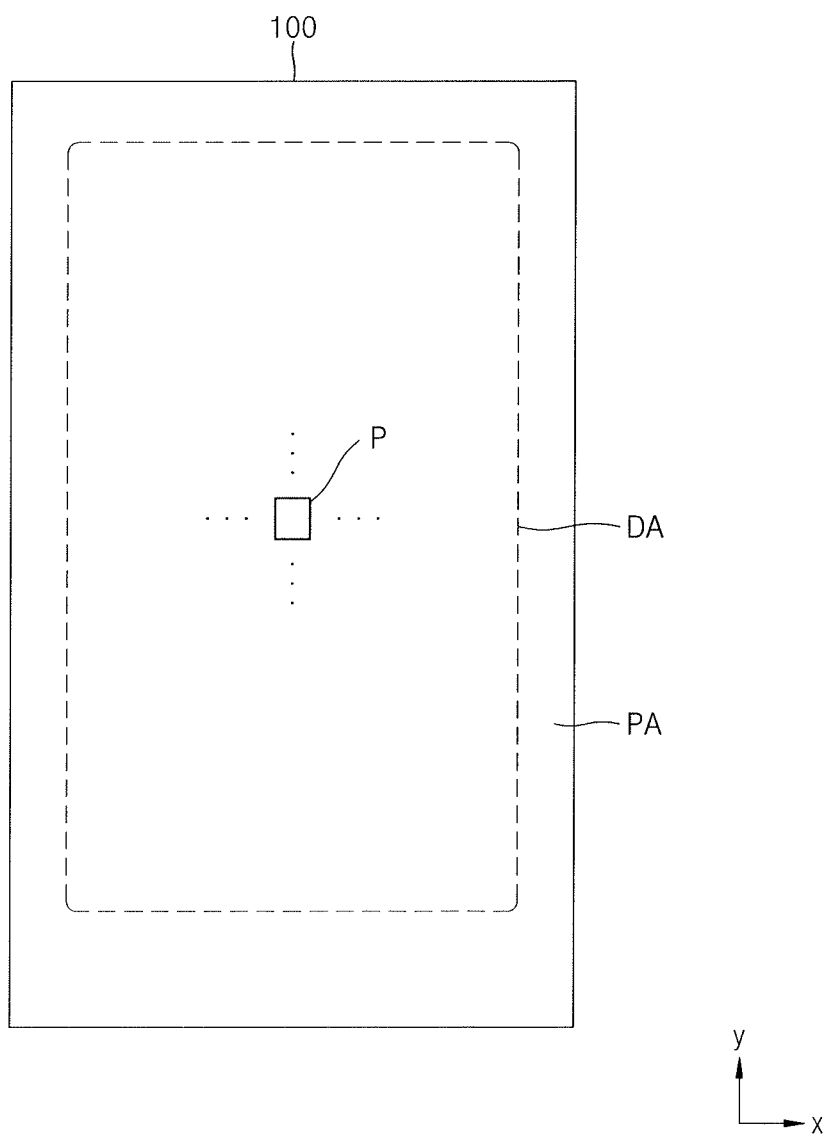
FIG. 1 illustrates a schematic plan view of a display device according to an embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. In addition, it will also be understood that when a layer is referred to as being "between" two layers, it can be the only layer between the two layers, or one or more intervening layers may also be present. Like reference numerals refer to like elements throughout.

It will be understood that although the terms "first," "second," etc. may be used herein to describe various components, these components should not be limited by these terms. These components are only used to distinguish one component from another.

As used herein, the singular forms "a," "an" and "the" are intended to include the plural forms as well, unless the context clearly indicates otherwise.

FIG. 1 illustrates a schematic plan view of a display device according to an embodiment.

Referring to FIG. 1, a display device may include a substrate 100. The substrate 100 may include a display area DA and a peripheral area PA outside the display area DA. Various display elements such as an organic light-emitting diodes (OLEDs) may be disposed in the display area DA of the substrate 100 in a form of pixels P. The peripheral area PA of the substrate 100 corresponds to a non-display area that does not provide an image. Various wires to transmit electrical signals to be applied to the display area DA may be located in the peripheral area PA. In the following description, for convenience of explanation, a display device having an OLED as a display element is described.

Figure 2:
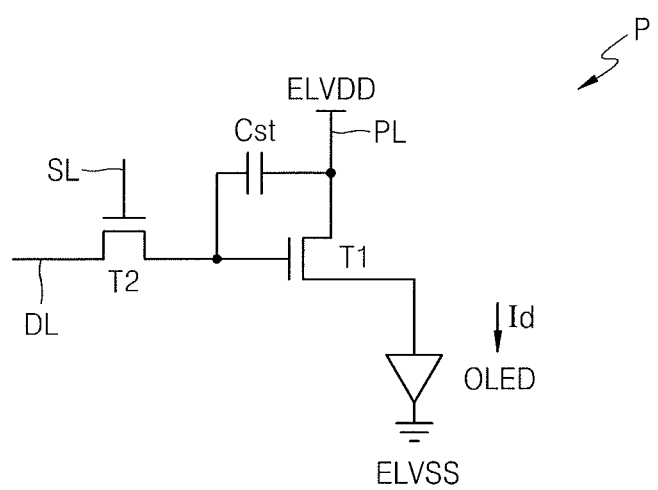
FIG. 2 illustrates an equivalent circuit diagram of a pixel in a display area of a display device.

FIG. 2 illustrates an equivalent circuit diagram of a pixel P in the display area DA of a display device. FIG. 2 illustrates a case in which the pixel P includes an OLED.

Referring to FIG. 2, the pixel P may include a first thin film transistor (TFT) T1, a second TFT T2, a storage capacitor Cst, and an OLED. FIG. 2 illustrates that a pixel electrode of the OLED is connected to the first TFT T1, and a counter electrode of the OLED receives a common voltage ELVSS through a wire.

The second TFT T2, as a switching TFT, may be connected to a scan line SL and a data line DL. The second TFT T2 may transmit, to the first TFT T1, a data voltage input through the data line DL according to a switching voltage input through the scan line SL.

The storage capacitor Cst may be connected to the second TFT T2 and a driving voltage line PL. The storage capacitor Cst may store a voltage corresponding to a difference between the voltage transmitted from the second TFT T2 and a voltage ELVDD provided to the driving voltage line PL.

The first TFT T1, as a driving TFT, is connected to the driving voltage line PL and the storage capacitor Cst. The first TFT T1 may control a driving current Id flowing from the driving voltage line PL to the OLED in response to a value of the voltage stored in the storage capacitor Cst. The OLED may emit light having a certain luminance according to the driving current Id. For example, the OLED may emit red, green, blue, or white light.

Although FIG. 2 illustrates that a circuit portion of the pixel P includes two TFTs and one storage capacitor Cst, in some implementations, to provide a high quality image on a display device, the design of the circuit portion connected to the OLED of the pixel P may be variously changed. For example, the pixel P may include three or more TFTs and/or two or more storage capacitors Cst.

Figure 3:
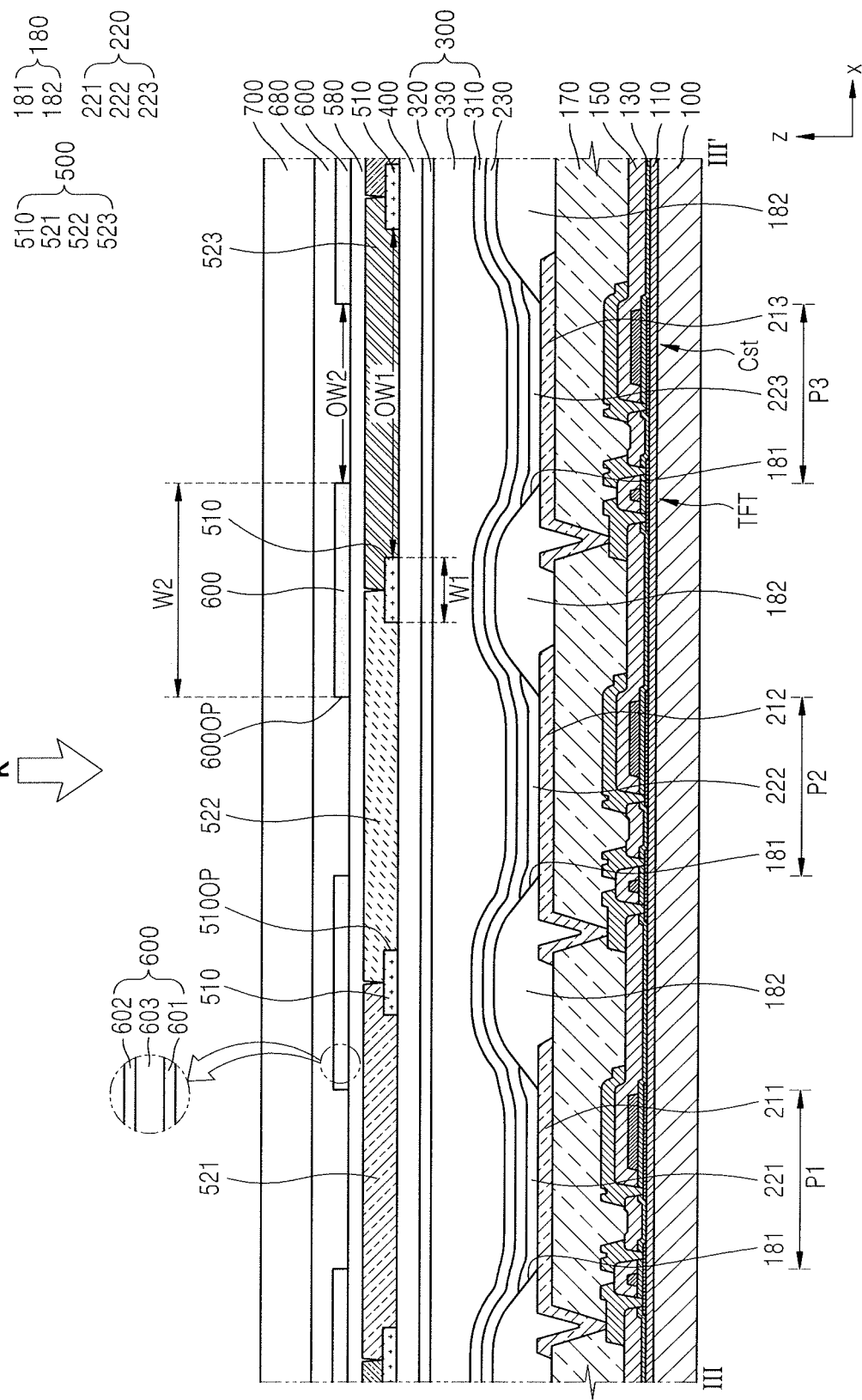
FIG. 3 illustrates a cross-sectional view of a portion of a display area of a display device according to an embodiment.
Figure 4:
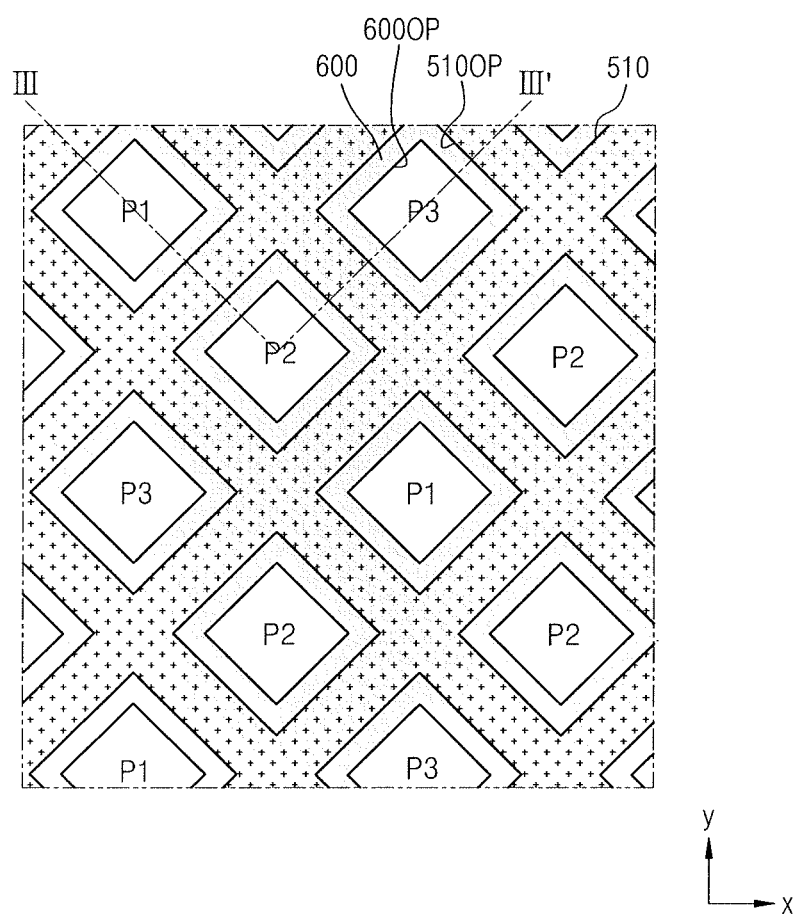
FIG. 4 illustrates a plan view of FIG. 3, viewed in a direction K.

FIG. 3 illustrates a cross-sectional view of a portion of the display area DA of a display device according to an embodiment. FIG. 4 illustrates a plan view of the display device illustrated in FIG. 3, viewed in a direction K. FIG. 3 may correspond to a cross-section taken along a line of FIG. 4.

Referring to FIG. 3, a circuit portion including a TFT and the storage capacitor Cst on the substrate 100 may be connected to a pixel electrode. In this regard, FIG. 3 illustrates first to third pixel electrodes 211, 212, and 213, which are respectively connected to the TFT and the storage capacitor Cst. The first to third pixel electrodes 211, 212, and 213 may be spaced apart from one another.

Various layers may be formed before the first to third pixel electrodes 211, 212, and 213 are formed on the substrate 100. In FIGS. 3 and 4, the TFT and the storage capacitor Cst are formed on the substrate 100, a planarization insulating layer 170 covering the TFT and the storage capacitor Cst is formed, and then the first to third pixel electrodes 211, 212, and 213 are formed on the planarization insulating layer 170.

The substrate 100 may be formed of a suitable material such as a glass material, a metal material, or a plastic material such as polyethylene terephthalate (PET), polyethylene naphthalate (PEN), or a polyimide. A buffer layer 110 that prevents the intrusion of impurities into a semiconductor layer of the TFT, a gate insulating layer 130 that insulates the semiconductor layer from a gate electrode of the TFT, an interlayer insulating layer 150 that insulates a source electrode and drain electrode from the gate electrode of the TFT, and the planarization insulating layer 170 that covers the TFT and has an upper surface that is substantially flat, may be formed on the substrate 100.

The buffer layer 110 may include an oxide film such as silicon oxide (SiOx), and/or a nitride film such as silicon nitride (SiNx). The gate insulating layer 130 and the interlayer insulating layer 150 may include SiOx, SiNx, silicon oxynitride (SiON), aluminum oxide (Al$_2$O$_3$), titanium oxide (TiO$_2$), tantalum oxide (Ta$_2$O$_5$), hafnium oxide (HfO$_2$), or zinc oxide (ZnO$_2$). The planarization insulating layer 170 may include an organic material such as acryl, benzocyclobutene (BCB), polyimide, or hexamethyldisiloxane (HMDSO). The buffer layer 110, the gate insulating layer 130, the interlayer insulating layer 150, and the planarization insulating layer 170 each may be in a form of a single layer or a multilayer.

Although FIG. 3 illustrates the insulating layers as disposed from the buffer layer 110 to the planarization insulating layer 170, in some embodiments, one or more insulating layers may be further disposed according to structures of the TFT and the storage capacitor Cst.

The first to third pixel electrodes 211, 212, and 213 may include a reflection film including silver (Al), magnesium (Mg), aluminum (Al), platinum (Pt), palladium (Pd), gold (Au), nickel (Ni), neodymium (Nd), iridium (Ir), chromium (Cr), or a compound thereof, and/or a transparent conductive oxide (TCO) layer on the reflection film. The TCO layer may be formed of a conductive oxide such as, for example, indium tin oxide (ITO), indium zinc oxide (IZO), zinc oxide (ZnO), indium oxide (In$_2$O$_3$), indium gallium oxide (IGO), or aluminum zinc oxide (AZO). In the present specification, the term "being transparent" may be understood as referring to having a high light transmittance, for example a light transmittance of about 85% or more, or about 90% or more, or about 95% or more.

The first to third pixel electrodes 211, 212, and 213 each may be in a form of a single layer or a multilayer. The first to third pixel electrodes 211, 212, and 213 may be provided by forming, for example, a layer including a material that forms the first to third pixel electrodes 211, 212, and 213 on the planarization insulating layer 170 and then wet etching the layer.

A pixel defining layer 180 may be disposed on the first to third pixel electrodes 211, 212, and 213. The pixel defining layer 180 may include an opening 181 exposing each of the first to third pixel electrodes 211, 212, and 213 and a mound portion 182 between the openings 181. The pixel defining layer 180 may include an organic material and/or an inorganic material, and may be in a form of a single layer or a multilayer. The organic material may include an olefin-based organic material, an acryl-based organic material or an imide-based organic material. The imide-based organic material may be, for example, polyimide (PI). The inorganic material may include silicon oxide or silicon nitride.

An intermediate layer 220 may be disposed on the pixel defining layer 180. The intermediate layer 220 may include a first intermediate layer 221 emitting red light, a second intermediate layer 222 emitting green light, and a third intermediate layer 223 emitting blue light.

The first intermediate layer 221 may include an emission layer that emits red light. For example, the first intermediate layer 221 may be a red organic emission layer. The red organic emission layer may include a fluorescent material or a phosphorescent material that emits red light. The second intermediate layer 222 may include an emission layer emitting green light. For example, the second intermediate layer 22 may be a green organic emission layer. The third intermediate layer 223 may include an emission layer emitting blue light. For example, the third intermediate layer 223 may be a blue organic emission layer.

Each of the first to third intermediate layers 221, 222, and 223 may further include first and second functional layers disposed above and/or under the emission layer.

The first functional layer may be in a form of a single layer or a multilayer. For example, when the first functional layer is formed of a polymer material, the first functional layer may be a single layer of a hole transport layer (HTL). For example, the first functional layer may be formed of poly-(3,4)-ethylene-dihydroxy thiophene (PEDOT) or polyaniline (PANI). When the first functional layer is formed of a low molecular material, the first functional layer may include a hole injection layer (HIL) and a HTL.

The second functional layer is not necessarily formed. For example, when the first functional layer and a first emission layer are formed of a polymer material, the second functional layer may be omitted. When the first functional layer and the first emission layer are formed of a low molecular material, the second functional layer may be formed to improve the characteristics of the OLED. In this case, the second functional layer may be in the form of a single layer or multilayer structure. The second functional layer may include an electron transport layer (ETL) and/or an electron injection layer (EIL).

A counter electrode 230 may be disposed on the intermediate layer 220. The counter electrode 230 may include a conductive metal film including, for example, silver (Ag), magnesium (Mg), aluminum (Al), ytterbium (Yb), calcium (Ca), lithium (Li), gold (Au), or a compound thereof, and/or a conductive oxide film such as a TCO layer. The TCO may include indium tin oxide (ITO), indium zinc oxide (IZO), zinc oxide (ZnO), indium oxide (In$_2$O$_3$), indium gallium oxide (IGO), or aluminum zinc oxide (AZO).

An encapsulation layer 300 may be disposed on the counter electrode 230. The encapsulation layer 300 may include at least one inorganic encapsulation layer and at least one organic encapsulation layer. For example, the encapsulation layer 300 may include a first inorganic encapsulation layer 310, a second inorganic encapsulation layer 320, and an organic encapsulation layer 330 therebetween.

The first and second inorganic encapsulation layers 310 and 320 may include one or more materials such as silicon nitride, aluminum nitride, zirconium nitride, titanium nitride, hafnium nitride, tantalum nitride, silicon oxide, aluminum oxide, titanium oxide, tin oxide, cerium oxide, and silicon oxynitride (SiON). The first and second inorganic encapsulation layers 310 and 320 may be formed by a chemical vapor deposition (CVD) method.

An organic encapsulation layer 330 may include, for example, poly(methyl methacrylate) (PMMA), polycarbonate (PC), polystyrene (PS), acryl-based resin, epoxy-based resin, polyimide, or polyethylene.

A touch electrode layer 400 including a touch electrode may be disposed on the encapsulation layer 300. The touch electrode may be a light-transmitting electrode. The touch electrode layer 400 may include touch electrodes disposed in a first direction in a plan view and touch electrodes disposed in a second direction crossing the first direction in a plan view, for example, in a direction perpendicular to the first direction.

A color filter layer 500 may be disposed on the touch electrode layer 400. The color filter layer 500 may include a black matrix 510 and first to third color filters 521, 522, and 523. The first color filter 521 may be a red color filter for transmitting red light. The second color filter 522 may be a green color filter for transmitting green light. The third color filter 523 may be a blue color filter for transmitting blue light. The black matrix 510 may be disposed between neighboring color filters, and may be disposed surrounding edges of pixels P1, P2, and P3.

When external light is incident upon the color filter layer 500, only a very small amount of the incident external light is reflected, and thus visibility and clarity of a displayed image may be improved. To prevent external light from being reflected and viewed again by a user, a polarized panel could be used. However, when a polarized panel is used, manufacturing costs may be increased. Moreover, a polarized panel may be difficult to bend due to a relatively large thickness thereof. According to the present embodiment, the color filter layer 500 includes the black matrix 510 and the first to third color filters 521, 522, and 523, accordingly, the reflection of external light may be reduced without a polarizer.

A light transmission control layer 600 may be disposed on the color filter layer 500. Accordingly, the color filter layer 500 may be located between the encapsulation layer 300 and the light transmission control layer 600. The light transmission control layer 600 may include an electrochromic device. For example, the light transmission control layer 600 may include first and second electrode layers 601 and 602 overlapping with each other and an electro-chromic material (ECM) 603) interposed between the first and second electrode layers 601 and 602. The light transmission control layer 600 may include a suspended-particle device or polymer dispersed liquid crystal. The light transmittance of the light transmission control layer 600 may be changed by an electrical signal. When an electrical signal is applied to the light transmission control layer 600, the light transmittance of the light transmission control layer 600 may be about 90% or more. When no electrical signal is applied thereto, the light transmittance of the light transmission control layer 600 may be about 10% or less. The light transmission control layer 600 may be disposed on the color filter layer 500 with an overcoat layer 580 interposed between the color filter layer 500 and the light transmission control layer 600. The overcoat layer 580 may have an upper surface that is substantially flat, and may serve as a planarization film. The overcoat layer 580 may include a light-transmitting organic material.

A window 700 may be disposed on the light transmission control layer 600, with a transparent adhesive layer 680 interposed between the light transmission control layer 600 and the window 700. The window 700 may include a transparent (light-transmitting) material. For example, the window 700 may include a glass substrate or a polymer substrate. For example, the window 700 may include a polymer such as polyimide to increase flexibility.

The black matrix 510 and the light transmission control layer 600, as illustrated in FIG. 3, may be disposed to overlap the mound portion 182 of the pixel defining layer 180. A width W1 of the black matrix 510 may be less than a width W2 of the light transmission control layer 600.

As illustrated in FIGS. 3 and 4, the black matrix 510 and the light transmission control layer 600 may respectively include open areas 510OP and 600OP. In the present specification, an "open area of A" may be understood as an area where a material forming A is not disposed. For example, the open area 510OP of the black matrix 510 corresponds to an area where a material forming the black matrix 510 is not disposed, and the open area 600OP of the light transmission control layer 600 corresponds to an area where a material provided in the light transmission control layer 600, for example, an ECM, is not provided.

The open area 510OP of the black matrix 510 and the open area 600OP of the light transmission control layer 600 may be disposed to overlap with each other. The open areas 510OP and 600OP of the black matrix 510 and the light transmission control layer 600 may overlap the pixels P1, P2, and P3. For example, the open areas 510OP and 600OP of the black matrix 510 and the light transmission control layer 600 may be disposed to overlap with emission areas of the pixels P1, P2, and P3. The black matrix 510 and the light transmission control layer 600 may have a net structure (or a lattice structure or a mesh structure) surrounding edges of the pixels P1, P2, and P3, as illustrated in FIG. 4. As an example of an arrangement of pixels P1, P2, and P3 in a plan view, FIG. 4 illustrates a PenTile structure in which some of the pixels P1, P2, and P3, for example, the pixels P1 and P3, are disposed around the other pixel P2.

The open area 600OP of the light transmission control layer 600 may be smaller than the open area 510OP of the black matrix 510. In this regard, FIG. 3 illustrates that a width OW2 of the open area 600OP of the light transmission control layer 600 is less than a width OW1 of the open area 510OP of the black matrix 510.

Figure 5:
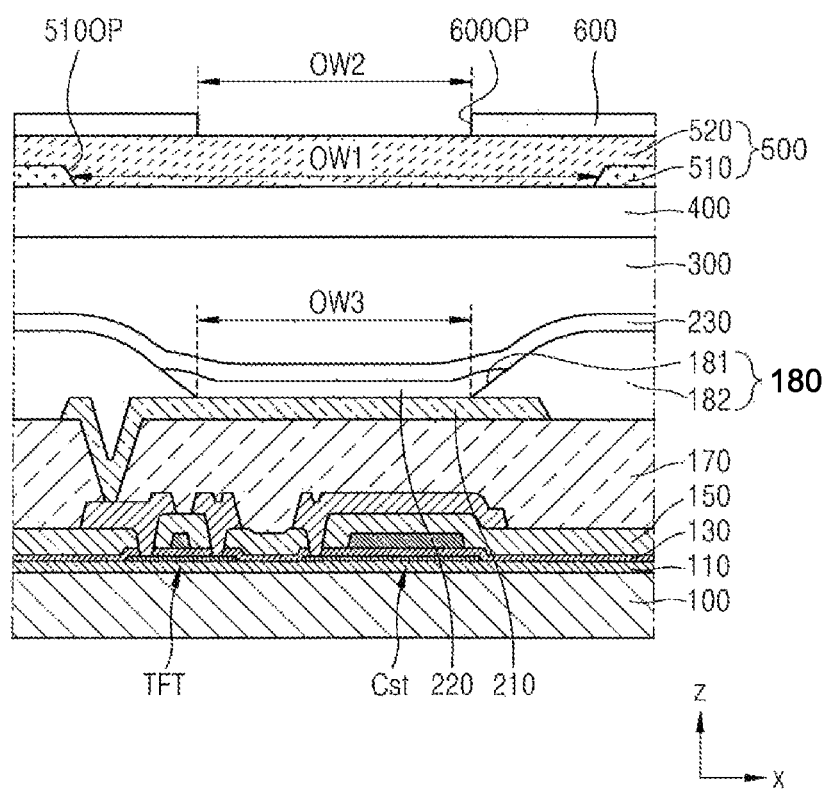
FIG. 5 illustrates a cross-sectional view of a pixel of a display device according to an embodiment.
Figure 6:
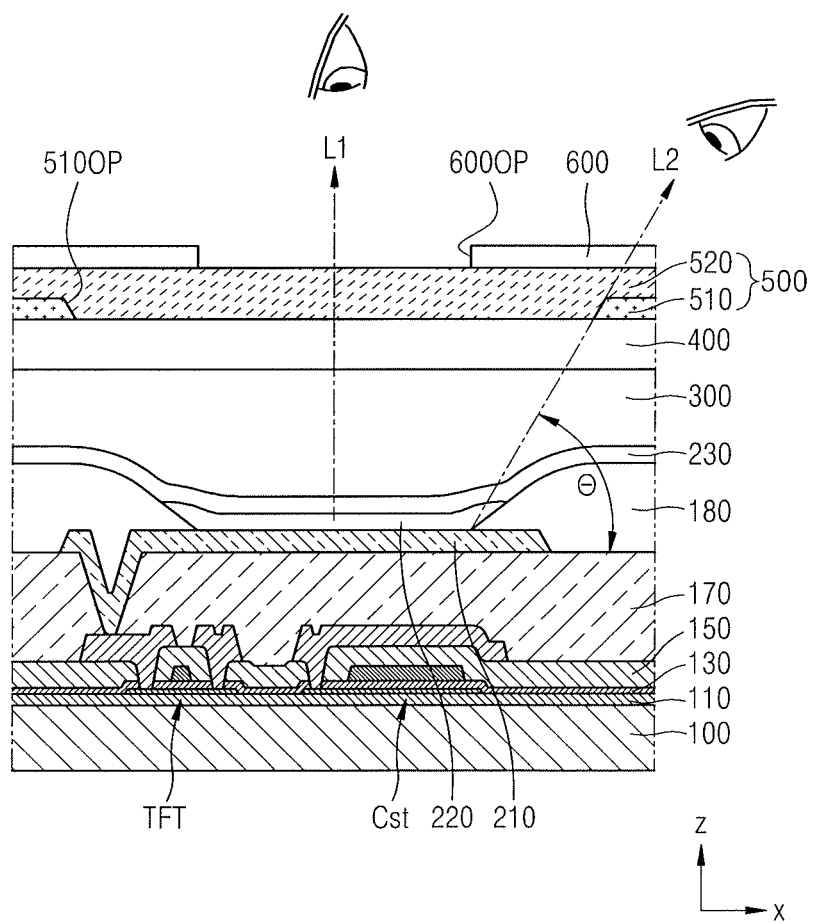
FIGS. 6 and 7 illustrate cross-sectional views depicting emission of light according to the on/off status of a light transmission control layer.
Figure 7:
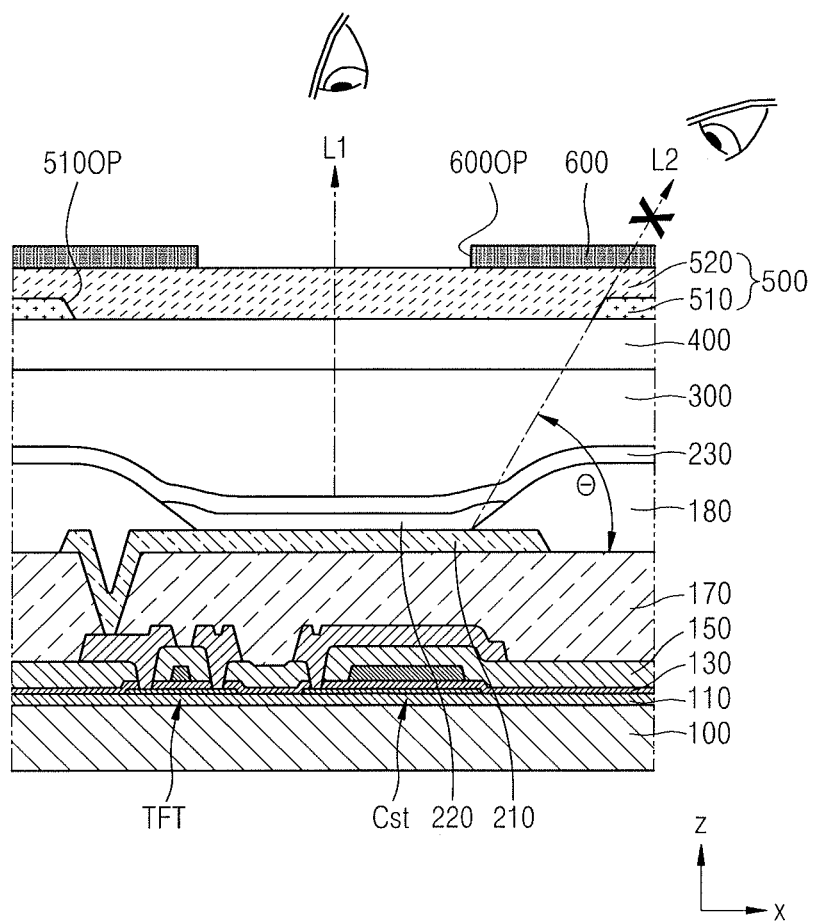

FIG. 5 illustrates a cross-sectional view of a pixel of a display device according to an embodiment. FIGS. 6 and 7 are cross-sectional views illustrating the emission of light according to the on/off status of the light transmission control layer 600. In FIGS. 5 to 7, layers above the light transmission control layer 600 are omitted for convenience of explanation. FIGS. 5 to 7 correspond to a cross-section of any one of the pixels P1, P2, and P3 described above with reference to FIG. 3. In FIG. 5, the pixel electrode 210 may be understood as one of the first to third pixel electrodes 211, 212, and 213, and the intermediate layer 220 may be understood as one of the first to third intermediate layers 221, 222, and 223.

Referring to FIG. 5, the open area 510OP of the black matrix 510 and the open area 600OP of the light transmission control layer 600 are disposed to overlap with each other, and further overlap with the opening 181 of the pixel defining layer 180. The stack structure of the pixel electrode 210 exposed through the opening 181 of the pixel defining layer 180, the intermediate layer 220, and the counter electrode 230 corresponds to an OLED 200. A width OW3 of the opening 181 of the pixel defining layer 180 may be understood as a width corresponding to a width of an emission area of a certain pixel.

When the opening 181 of the pixel defining layer 180, the open area 510OP of the black matrix 510, and the open area 600OP of the light transmission control layer 600 overlap one another, as illustrated in FIGS. 6 and 7, of the light emitted from the OLED 200, light L1 proceeding in a direction (z direction) perpendicular to an upper surface of the planarization insulating layer 170 (or an upper surface of the substrate 100) of the light emitted from the OLED 200 may be viewed by a user as it is.

The width OW1 of the open area 510OP of the black matrix 510 may be formed to be greater than the width OW3 of the opening 181 of the pixel defining layer 180. Accordingly, as illustrated in FIG. 6, light L2 obliquely proceeding with respect to the z direction may be viewed by the user without being blocked by the black matrix 510. The light L2 may form an acute angle θ with respect to the upper surface of the planarization insulating layer 170 (or an upper surface of the substrate 100)

An end portion of the light transmission control layer 600 that defines the open area 600OP may extend toward a center of the open area 600OP farther than an end portion of the black matrix 510 that defines the open area 510OP. Thus, the width OW2 of the open area 600OP of the light transmission control layer 600 may be less than the width OW1 of the open area 510OP of the black matrix 510. For example, the width OW2 of the open area 600OP of the light transmission control layer 600 may be formed to be substantially the same as the width OW3 of the opening 181 of the pixel defining layer 180.

The light transmission control layer 600 may improve a side view angle or restrict the reflection of the external light, by using light transmittance that is adjustable by an electrical signal.

In an embodiment, during an ON operation of the light transmission control layer 600, as illustrated in FIG. 6, the light transmittance of the light transmission control layer 600 increases. Accordingly, both the light L1 proceeding to the front side and the light L2 obliquely proceeding from the light emitted from the OILED 200 may be viewed by the user. In this state, as the width OW1 of the open area 510OP of the black matrix 510 is formed to be large, the light L2 obliquely proceeding may be viewed from the outside as described above. For example, when the light transmittance of the light transmission control layer 600 is about 90% or more, a decrease in the luminance of the light L2 obliquely proceeding may be reduced.

In another embodiment, during an OFF operation of the light transmission control layer 600, as illustrated in FIG. 7, the light transmittance of the light transmission control layer 600 decreases. The width OW1 of the open area 510OP of the black matrix 510 is formed to be large. However, although the light L2 obliquely proceeding may pass through the color filter layer 500, the light L2 is blocked by the light transmission control layer 600 and is not viewed from the outside. When the light transmittance of the light transmission control layer 600 is decreased, a viewing angle may be decreased, and thus privacy of a user may be protected. For example, the light transmittance of the light transmission control layer 600 may be decreased to be about 10% or less, and the light L2 obliquely proceeding may be blocked. The light transmission control layer 600 may perform a function, along with the black matrix 510, of restricting the reflection of the external light. The reflection of the external light may be understood as the reflection of light externally incident on a display device by layers (electrode, wiring, etc.) of the display device.

Figure 8:
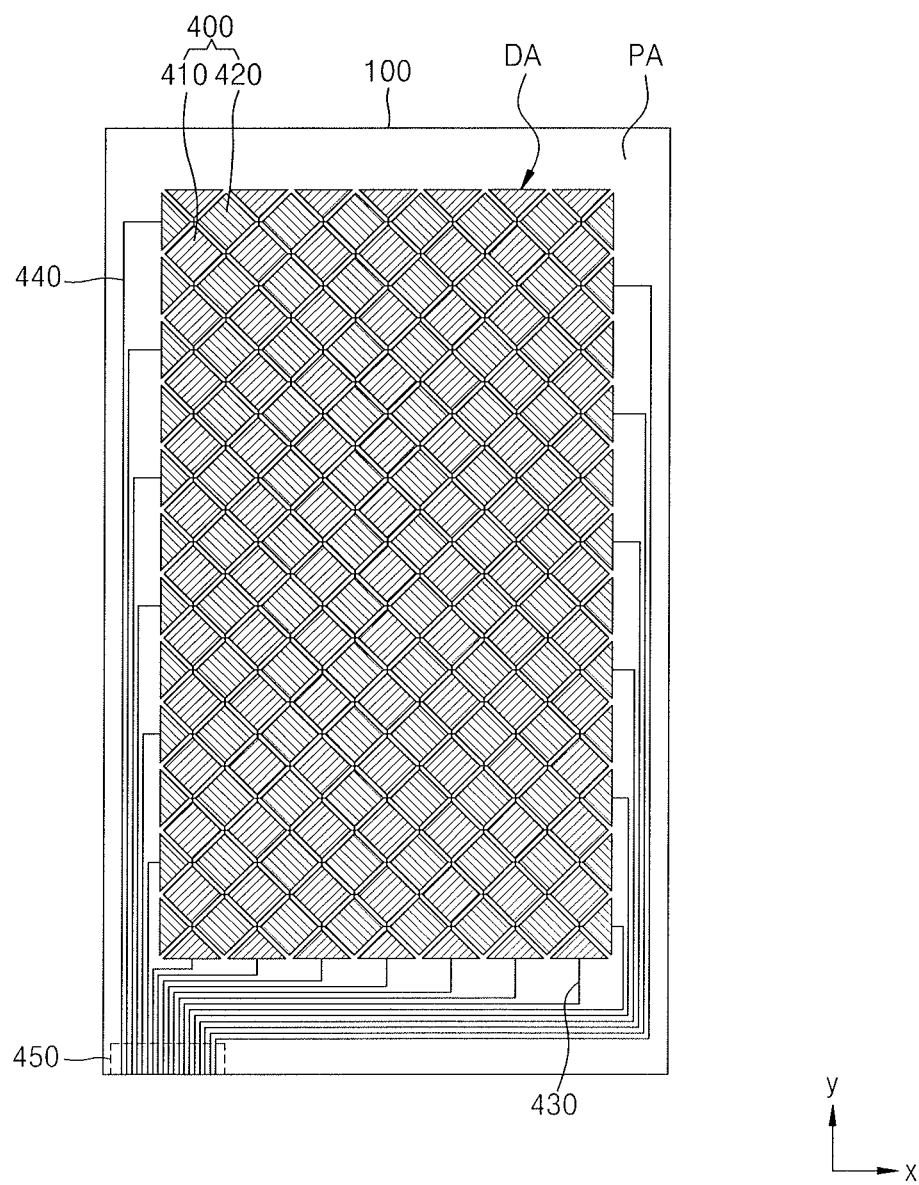
FIG. 8 illustrates a plan view of a touch electrode layer of a display device according to an embodiment.
Figure 9:
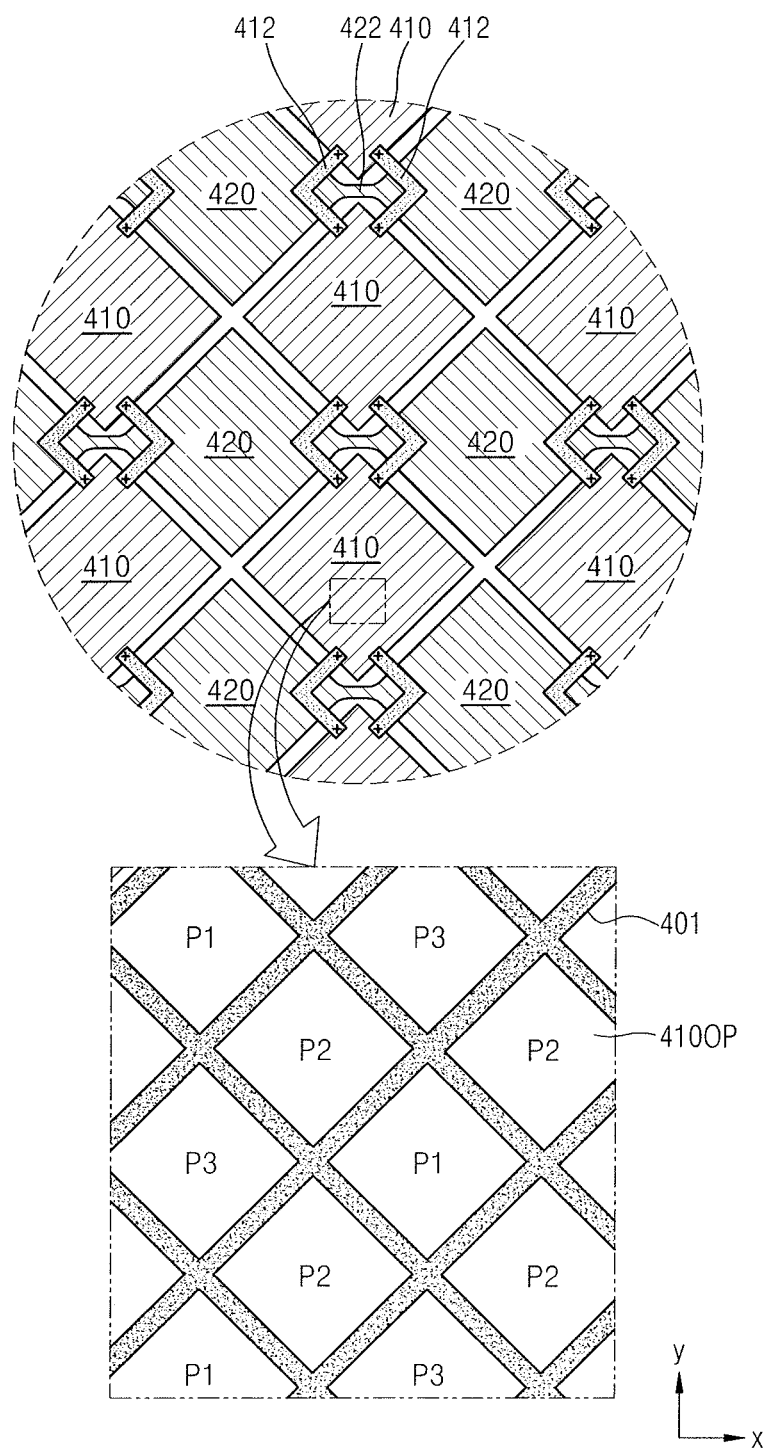
FIG. 9 illustrates a plan view of a portion corresponding to a display area of FIG. 8.

FIG. 8 illustrates a plan view of the touch electrode layer 400 of a display device according to an embodiment. FIG. 9 illustrates a plan view of a portion corresponding to the display area DA of FIG. 8.

Referring to FIG. 8, the touch electrode layer 400 may include a plurality of first touch electrodes 410 arranged in a first direction (y direction) and a plurality of second touch electrodes 420 arranged in a second direction (x direction) substantially perpendicular to the first direction. The first touch electrodes 410 and the second touch electrodes 420 may be arranged to alternate with each other. For example, the first touch electrodes 410 may be arranged in parallel with corners adjacent to each other in the first direction. The second touch electrodes 420 between the first touch electrodes 410 may be arranged in parallel with corners adjacent to each other in the second direction.

The first touch electrodes 410 disposed in the first direction may be electrically connected to each other, and the second touch electrodes 420 disposed in the second direction may be electrically connected to each other. For example, as illustrated in FIG. 9, the first touch electrodes 410 may be connected to each other by a first connection line 412. The second touch electrodes 420 may be connected to each other by a second connection line 422. The first connection line 412 may be formed on a layer that is different from a layer on which the first touch electrodes 410 are disposed. The second connection line 422 may be formed on a same layer as the second touch electrodes 420.

The first and second touch electrodes 410 and 420 may be disposed on the same layer or on different layers with an insulating layer interposed therebetween. The first and second touch electrodes 410 and 420 and the first and second connection lines 412 and 422 may include silver (Al), copper (Cu), chromium (Cr), nickel (Ni), titanium (Ti), etc., or may include a transparent conductive layer such as ITO, IZO, or ZnO.

A column of the first touch electrodes 410 and a row of the second touch electrodes 420 disposed in the second direction may be connected to sensing lines 430 and 440 as illustrated in FIG. 8. Signals obtained through the sensing lines 430 and 440 may be provided, through a pad 450, to a circuit portion including a position detection circuit.

Referring to an enlarged portion of FIG. 9, each of the first touch electrodes 410 may include an open area 410OP corresponding to the pixels P1, P2, and P3, and a wire portion 401 defining the open area 410OP. The wire portion 401 may be formed to surround at least a part of the pixels P1, P2, and P3. In FIG. 9, the wire portion 401 of the first touch electrode 410 may surround each of the pixels P1, P2, and P3, and thus, the open areas 410OP defined by the wire portion 401 may be spaced apart from each other. In another embodiment, the wire portion 401 may partially surrounds some of the pixels P1, P2, and P3, and the open areas 410OP corresponding to the pixels may be spatially connected to each other.

When the first touch electrode 410 includes the open area 410OP corresponding to the pixels P1, P2, and P3, a decrease in the luminance of light proceeding from the pixels P1, P2, and P3 by the material forming the first touch electrode 410 may be prevented. Although the enlarged portion of FIG. 9 illustrates the first touch electrode 410, the second touch electrodes 420, like the first touch electrode 410, may include an open area.

Figure 10:
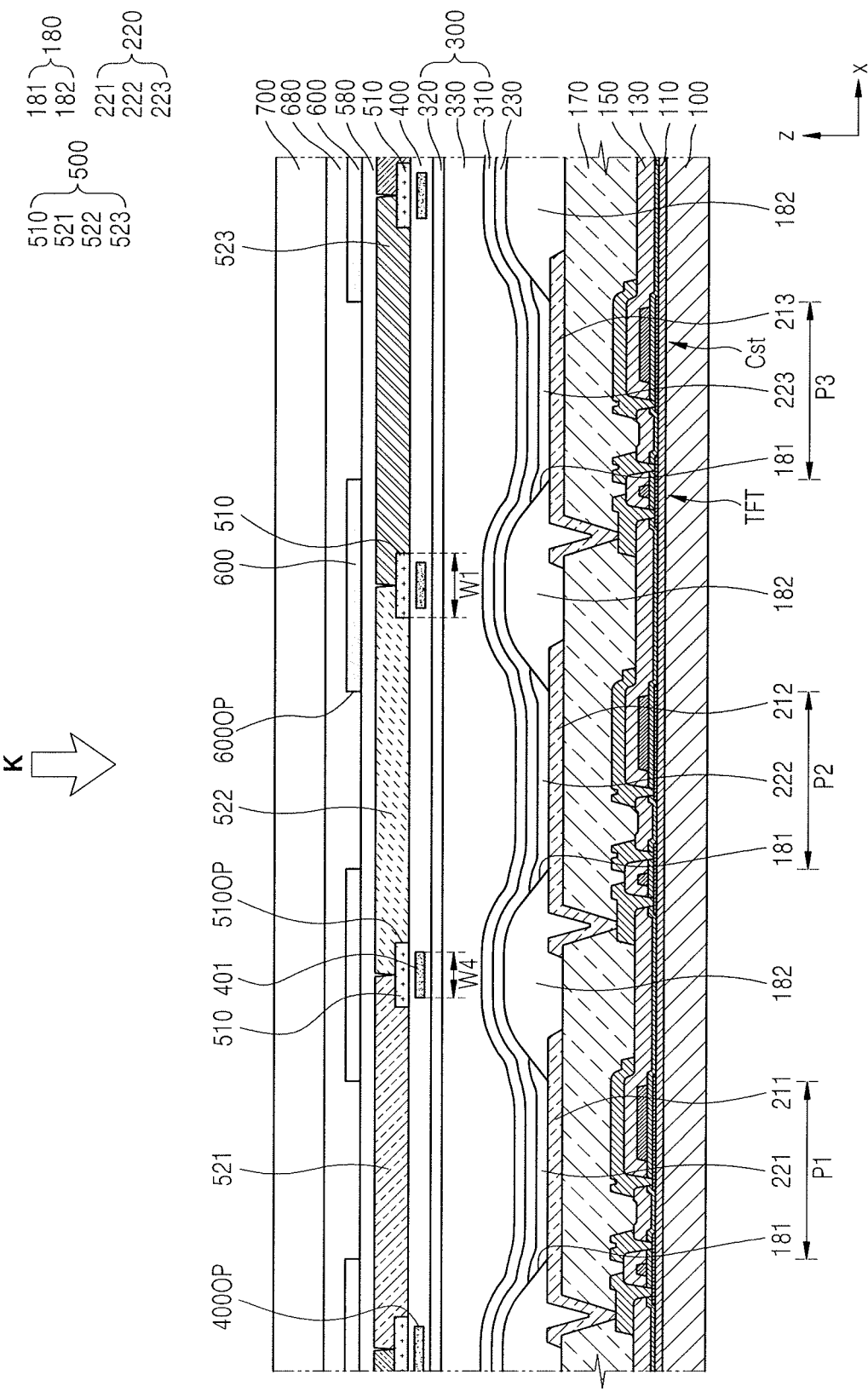
FIG. 10 illustrates a schematic cross-sectional view of a display device according to an embodiment.
Figure 11:
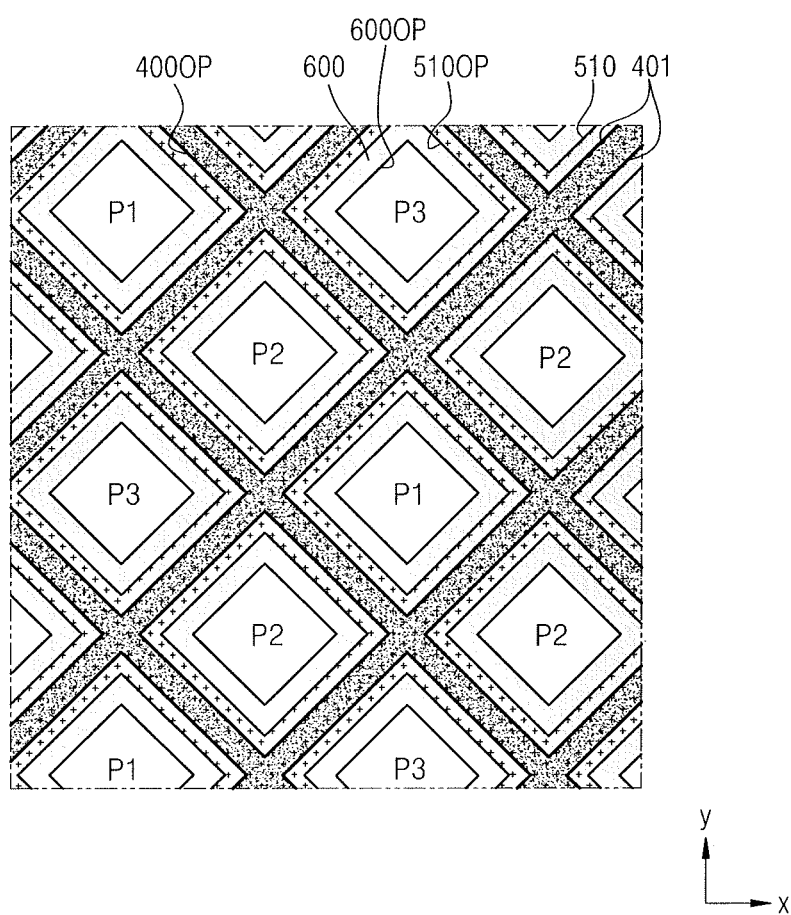
FIG. 11 illustrates a plan view of the device illustrated in FIG. 10, viewed in the direction K.

FIG. 10 illustrates a schematic cross-sectional view of a display device according to another embodiment. FIG. 11 illustrates a plan view the display device of FIG. 10, viewed in the direction K. Constituent elements of the display device of FIG. 10, except for the touch electrode layer, may be the same as those of the display device described with reference to FIG. 3. Accordingly, the following description will focus mainly on differences therebetween.

Referring to FIG. 10, the touch electrode layer 400 may include a wire portion 401 and an open area 400OP. The wire portion 401 and the open area 400OP of FIG. 10 may be understood as a wire portion and an open area of any one of the first touch electrode and the second touch electrode described with reference to FIGS. 8 and 9.

The wire portion 401 of the touch electrode layer 400 may be disposed to overlap the mound portion 182 of the pixel defining layer 180, the black matrix 510, and the light transmission control layer 600. For example, a width W4 of the wire portion 401 may be the same as or less than the width W1 of the black matrix 510. In this case, when the touch electrode layer 400 is provided between the substrate 100 and the color filter layer 500, it is possible to prevent light from the OLED from being reflected or interfered with by the wiring part 401.

As described above, the open area 400OP of the touch electrode layer 400 may overlap the open area 510OP of the black matrix 510 and the open area 600OP of the light transmission control layer 600. In addition, the first to third color filters 521, 522, and 523 may be disposed in the open area 510OP of the black matrix 510 as illustrated in FIG. 10.

Thus, the reflection of the external light may be reduced even more, and a side viewing angle may be increased.

Figure 12:
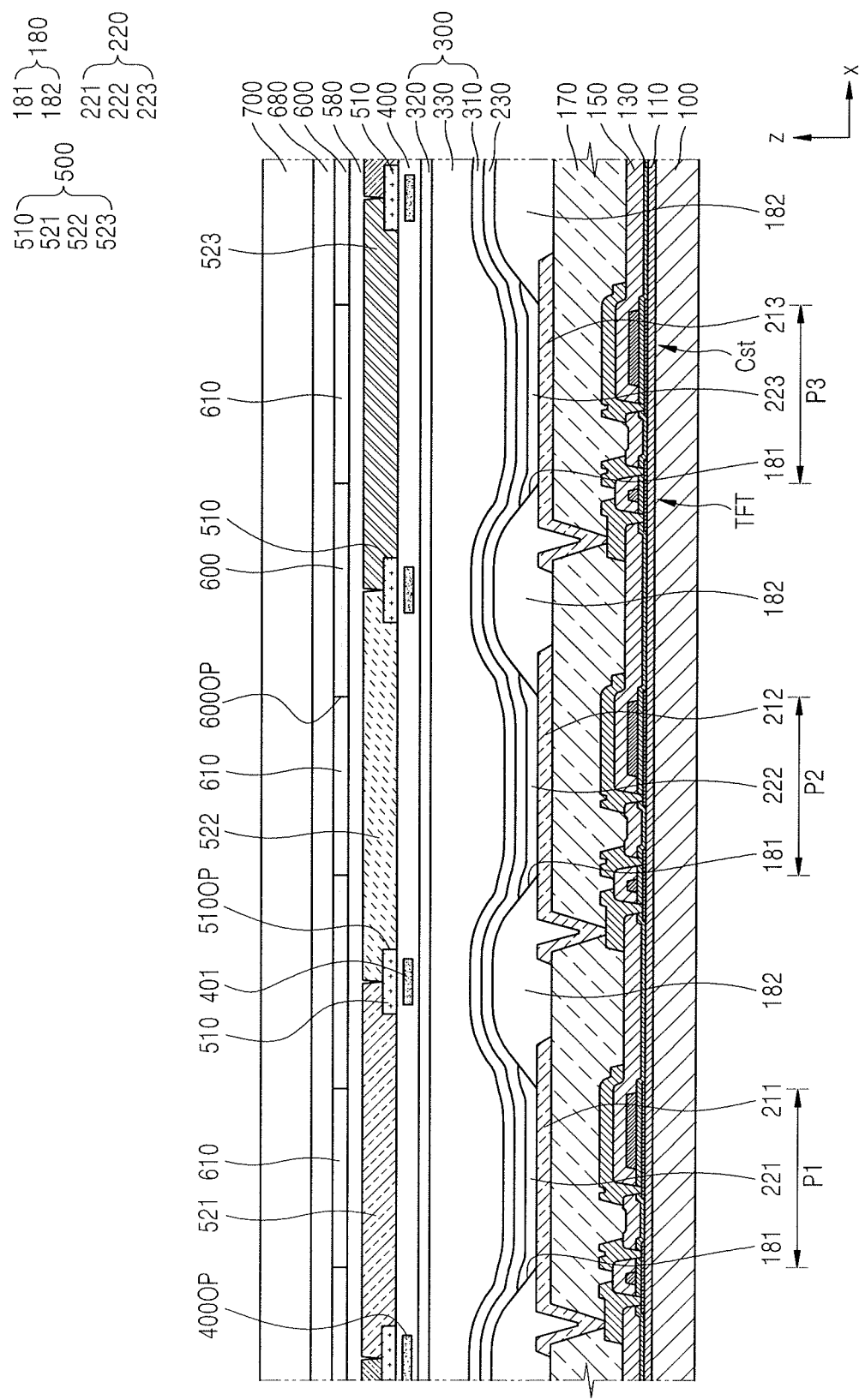
FIG. 12 illustrates a schematic cross-sectional view of a display device according to an embodiment.

FIG. 12 illustrates a schematic cross-sectional view of a display device according to another embodiment.

Other constituent elements of the display device of FIG. 12, except for a light transmission control layer 600, may be the same as those of the display device described above with reference to FIG. 3, Accordingly, the following description will focus mainly on differences therebetween.

Referring to FIG. 12, the light transmission control layer 600 may further include a transmission material layer 610 corresponding to the open area 600OP. The transmission material layer 610 may include a transparent material, for example, a transparent organic material. The light transmittance of the transmission material layer 610 may be substantially the same as or greater than that of the transparent adhesive layer 680. The light transmission control layer 600 and the transmission material layer 610 may be in a form of an integrated film.

The display devices according to the above-described embodiments may prevent or reduce the reflection of external light, improve a side viewing angle, and provide a high quality image in which an image provided by the display device is prevented from being viewed by a third party.

By way of summation and review, although an image by a display device needs to be provided to a user without being affected by circumstances, the quality of image may deteriorate by a limitation of the display device itself and the influence of circumstances. Embodiments provide a display device that may provide a high quality image Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope thereof as set forth in the following claims.

What is claimed is:

1. A display device, comprising:
a substrate;
a circuit portion including a thin film transistor on the substrate;
a display element on the circuit portion, the display element including a pixel electrode electrically connected to the thin film transistor;
an encapsulation layer covering the display element;
a color filter layer on the encapsulation layer, the color filter layer including a black matrix and a color filter; and
a light transmission control layer located farther from the display element than the color filter layer in a direction perpendicular to an upper surface of the substrate, the light transmission control layer having light transmittance that varies according to an electrical signal,
wherein:
the light transmission control layer overlaps the black matrix,
a width of the light transmission control layer is greater than a width of the black matrix, and
the light transmission control layer includes an open area corresponding to the pixel electrode in plan view.

2. The display device as claimed in claim 1, wherein:
the black matrix includes an open area corresponding to the pixel electrode in plan view, and
a width of the open area of the light transmission control layer is less than a width of the open area of the black matrix.

3. The display device as claimed in claim 1, wherein:
the pixel electrode includes a first pixel electrode and a second pixel electrode that neighbor each other,
the display device further includes a pixel defining layer having openings that respectively expose the first pixel electrode and the second pixel electrode, and a mound portion between the openings in plan view, and
the black matrix and the light transmission control layer overlap the mound portion of the pixel defining layer in plan view.

4. The display device as claimed in claim 3, wherein:
the black matrix includes open areas corresponding to each of the first pixel electrode and the second pixel electrode in plan view, and
a width of each of the open areas of the black matrix is greater than a width of a corresponding one of the openings of the pixel defining layer.

5. The display device as claimed in claim 3, wherein:
the light transmission control layer includes open areas corresponding to each of the first pixel electrode and the second pixel electrode in plan view, and
a width of the open areas of the light transmission control layer is substantially the same as the width of a corresponding one of the openings of the pixel defining layer in plan view.

6. The display device as claimed in claim 1, wherein the light transmission control layer has a light transmittance of 90% or more when an electrical signal is applied thereto.

7. The display device as claimed in claim 1, further comprising a touch electrode layer between the encapsulation layer and the color filter layer, the touch electrode layer including a touch electrode.

8. The display device as claimed in claim 1, wherein the display element includes an organic light-emitting diode.

9. The display device as claimed in claim 1, wherein the light transmission control layer includes at least one of a suspended-particle device layer and a polymer dispersed liquid crystal layer.

10. A display device, comprising:
a substrate;
a first pixel electrode and a second pixel electrode on the substrate;
a pixel defining layer including openings that respectively expose the first pixel electrode and the second pixel electrode, and a mound portion between the openings;
a first intermediate layer overlapping the first pixel electrode in one of the openings of the pixel defining layer;
a second intermediate layer overlapping the second pixel electrode in another one the openings of the pixel defining layer;
a counter electrode covering the first intermediate layer and the second intermediate layer;
a color filter layer on the counter electrode, the color filter layer including a black matrix and a color filter; and
a light transmission control layer located farther from the substrate than the color filter layer in a direction perpendicular to an upper surface of the substrate, the light transmission control layer having a light transmittance that varies according to an electrical signal, wherein:
the black matrix and the light transmission control layer include open areas respectively corresponding to the first pixel electrode and the second pixel electrode in plan view, and
a width of the each of the open areas of the light transmission control layer is less than a width of a corresponding one of the open areas of the black matrix.

11. The display device as claimed in claim 10, wherein a width of each of the open areas of the light transmission control layer is substantially the same as a width of a corresponding one of the openings of the pixel defining layer.

12. The display device as claimed in claim 10, wherein a width of each of the open areas of the black matrix is greater than the width of a corresponding one of the openings of the pixel defining layer in plan view.

13. The display device as claimed in claim 10, wherein the light transmission control layer has light transmittance of 90% or more when an electrical signal is applied thereto.

14. The display device as claimed in claim 10, further comprising an encapsulation layer between the counter electrode and the color filter layer, the encapsulation layer including at least one inorganic encapsulation layer and at least one organic encapsulation layer.

15. The display device as claimed in claim 10, further comprising a touch electrode layer between the counter electrode and the color filter layer, the touch electrode layer including a touch electrode.

16. The display device as claimed in claim 15, wherein the touch electrode includes an open area that overlaps an open area of the black matrix in plan view.

17. The display device as claimed in claim 10, wherein each of the first intermediate layer and the second intermediate layer includes an emission layer.

18. The display device as claimed in claim 10, wherein the light transmission control layer includes at least one of a suspended-particle device layer and a polymer dispersed liquid crystal layer.

* * * * *